United States Patent
Kim et al.

(10) Patent No.: US 10,192,889 B2
(45) Date of Patent: Jan. 29, 2019

(54) DISPLAY DEVICE AND METHOD OF MANUFACTURING A DISPLAY DEVICE

(71) Applicant: SAMSUNG DISPLAY CO., LTD., Yongin-si, Gyeonggi-do (KR)

(72) Inventors: Jisun Kim, Seoul (KR); Chongchul Chai, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 177 days.

(21) Appl. No.: 15/053,483

(22) Filed: Feb. 25, 2016

(65) Prior Publication Data

US 2016/0370663 A1 Dec. 22, 2016

(30) Foreign Application Priority Data

Jun. 16, 2015 (KR) ........................ 10-2015-0085013

(51) Int. Cl.
*G02F 1/1333* (2006.01)
*H01L 27/12* (2006.01)
(Continued)

(52) U.S. Cl.
CPC .... *H01L 27/1225* (2013.01); *G02F 1/133345* (2013.01); *H01L 27/124* (2013.01); *H01L 27/1222* (2013.01); *H01L 27/1259* (2013.01); *H01L 29/42364* (2013.01); *H01L 29/42372* (2013.01); *H01L 29/42384* (2013.01); *H01L 29/66765* (2013.01); *H01L 29/66969* (2013.01); *H01L 29/7869* (2013.01); *H01L 29/78669* (2013.01); *H01L 29/78678* (2013.01); *G02F 2001/134372* (2013.01); *G02F 2001/136222* (2013.01); *G02F 2001/136231* (2013.01)

(58) Field of Classification Search
None
See application file for complete search history.

(56) References Cited

U.S. PATENT DOCUMENTS 7,846,619 B2 12/2010 Han
8,400,594 B2 3/2013 Takasawa et al.
(Continued)

FOREIGN PATENT DOCUMENTS

KR 10-0809331 2/2008
KR 1020110012370 2/2011
(Continued)

*Primary Examiner* — James Dudek
(74) *Attorney, Agent, or Firm* — F. Chau & Associates, LLC (57) ABSTRACT

A display device includes a first substrate including a display area and a non-display area. A gate line and a gate electrode are in the display area. A data line is connected to the gate line. A gate insulating layer is on the gate line and the gate electrode. A semiconductor layer is on the gate insulating layer. A drain electrode and a source electrode are on the semiconductor layer. A first passivation layer is on the drain electrode and the source electrode. A color filter is on the first passivation layer. A common electrode is on the first passivation layer. A second passivation layer is on the common electrode. A pixel electrode is on the second passivation layer. The gate insulating layer has substantially a same shape as a shape of the gate electrode. The gate insulating layer has a width wider than a width of the gate electrode.

13 Claims, 7 Drawing Sheets

(51) Int. Cl.
   *H01L 29/423*    (2006.01)
   *H01L 29/786*    (2006.01)
   *H01L 29/66*     (2006.01)
   *G02F 1/1362*    (2006.01)
   *G02F 1/1343*    (2006.01)

(56) References Cited

U.S. PATENT DOCUMENTS

| | | | | |
|---|---|---|---|---|
| 2006/0145157 | A1* | 7/2006 | Choi | G02F 1/13458 257/66 |
| 2009/0108280 | A1* | 4/2009 | Jan | H01L 27/1214 257/98 |
| 2016/0148838 | A1* | 5/2016 | Shu | H01L 27/124 257/72 |

FOREIGN PATENT DOCUMENTS

| | | |
|---|---|---|
| KR | 1020110056962 | 5/2011 |
| KR | 10-2012-0062692 | 6/2012 |

* cited by examiner

DISPLAY DEVICE AND METHOD OF MANUFACTURING A DISPLAY DEVICE

CROSS-REFERENCE TO RELATED APPLICATION

This application claims priority under 35 U.S.C. § 119 to Korean Patent Application No. 10-2015-0085013, filed on Jun. 16, 2015, in the Korean Intellectual Property Office (KIPO), the disclosure of which is incorporated by reference herein in its entirety.

TECHNICAL FIELD

Exemplary embodiments of the present invention relate to a display device, and more particularly to a method of manufacturing a display device.

DISCUSSION OF RELATED ART

A flat panel display ("FPD") device is a type of display device. Examples of the FPD device may include a liquid crystal display ("LCD") device, an organic light emitting diode ("OLED") display device, a plasma display panel ("PDP") device, an electrophoretic display ("EPD") device and an electrowetting display device.

An LCD device may include a pair of display substrates on which electric field generating electrodes, such as a pixel electrode and a common electrode, are formed and a liquid crystal layer disposed between the pair of display substrates. In such an LCD device, an electric field may be generated to be transmitted through a liquid crystal layer by voltages that are applied to electric field generating electrodes, and thus the orientation of liquid crystal molecules of the liquid crystal layer may be determined and the polarization of incident light may be controlled to display an image.

In the configuration of the LCD device, both of the two electric field generating electrodes that generate an electric field through the liquid crystal layer may be formed on a thin film transistor display substrate.

In the case that the two electric field generating electrodes are formed on the thin film transistor display substrate, a plurality of insulating layers may be disposed between the thin film transistor display substrate and the electric field generating electrode, and at least one of the plurality of insulating layers may use an organic insulating layer. A contact hole may be formed in the plurality of insulating layers to electrically connect the thin film transistor display substrate and the electric field generating electrode.

SUMMARY

Exemplary embodiments of the present invention may be directed to a display device having reduced manufacturing costs. The display device may be manufactured by a relatively small number of processes.

According to an exemplary embodiment of the present invention, a display device includes a first substrate including a display area and a non-display area. A gate line and a gate electrode are in the display area. A data line is connected to the gate line. A gate insulating layer is on the gate line and the gate electrode. A semiconductor layer is on the gate insulating layer. A drain electrode and a source electrode are on the semiconductor layer. A first passivation layer is on the drain electrode and the source electrode. A color filter is on the first passivation layer. A common electrode is on the first passivation layer. A second passiva-tion layer is on the common electrode. A pixel electrode is on the second passivation layer. The gate insulating layer has substantially a same shape as a shape of the gate electrode. The gate insulating layer has a width wider than a width of the gate electrode.

One of the drain electrode and the source electrode may contact an end portion of the gate insulating layer.

One of the drain electrode and the source electrode may be spaced apart from an end portion of the gate electrode.

The width of the gate insulating layer may be in a range of about 0.2 µm to about 4 µm wider than the width of the gate electrode.

The pixel electrode may be connected to the semiconductor layer.

The pixel electrode may include a plurality of cut-out portions, and the common electrode may have a planar shape.

The display device may include an overcoat layer between the color filter and the common electrode.

The display device may include a second substrate disposed opposite the first substrate, and a liquid crystal layer between the first substrate and the second substrate.

The semiconductor layer may include at least one selected from amorphous silicon, polysilicon, and an oxide semiconductor.

The display device may include a first pad electrode on the non-display area. A pad electrode insulating layer may be on the first pad electrode. The pad electrode insulating layer may have a contact hole through which a portion of the first pad electrode is exposed. A third passivation layer is on the pad electrode insulating layer. A second pad electrode is on the first pad electrode and the third passivation layer. The pad electrode insulating layer may have a shape similar to a shape of the first pad electrode. The pad electrode insulating layer may have a width wider than a width of the first pad electrode.

The width of the pad electrode insulating layer may be in a range of about 0.2 µm to about 4 µm wider than the width of the first pad electrode.

According to an exemplary embodiment of the present invention, a method of manufacturing a display device includes forming a first substrate including a display area and a non-display area. A gate line and a gate electrode are formed on the display area. A data line is connected to the gate electrode. A gate insulating layer is formed on the gate line and the gate electrode. A semiconductor layer is formed on the gate insulating layer. A drain electrode and a source electrode are formed on the semiconductor layer. A first passivation layer is formed on the drain electrode and the source electrode. A color filter is formed on the first passivation layer. A common electrode is formed on the first passivation layer. A second passivation layer is formed on the common electrode. A pixel electrode is formed on the second passivation layer. The forming of the gate electrode includes etching the gate electrode using the gate insulating layer as a mask.

The gate insulating layer may have a width in a range of about 0.2 µm to about 4 µm wider than a width of the gate electrode.

The method may include forming a second substrate opposing the first substrate.

The method may include forming a first pad electrode on the non-display area. A pad electrode insulating layer may be formed on the first pad electrode. A third passivation layer may be formed on the pad electrode insulating layer. A contact hole through which the first pad electrode is exposed may be formed. A second pad electrode may be formed on the first pad electrode and the third passivation layer. The forming of the first pad electrode may include etching the first pad electrode using the pad electrode insulating layer as a mask.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Exemplary embodiments of the present invention will now be described more fully hereinafter with reference to the accompanying drawings in which exemplary embodiments of the present invention are shown. Exemplary embodiments of the present invention may, however, be embodied in many different forms and should not be construed as being limited to the exemplary embodiments set forth herein. Like reference numerals refer to like elements throughout the specification and drawings.

In the drawings, thicknesses of a plurality of layers and areas may be illustrated in an enlarged manner for clarity of description. When a layer, area, or plate is referred to as being "on" another layer, area, or plate, it may be directly on the other layer, area, or plate, or intervening layers, areas, or plates may be present therebetween. When a layer, area, or plate is referred to as being "directly on" another layer, area, or plate, intervening layers, areas, or plates may be absent therebetween. When a layer, area, or plate is referred to as being "below" another layer, area, or plate, it may be directly below the other layer, area, or plate, or intervening layers, areas, or plates may be present therebetween. When a layer, area, or plate is referred to as being "directly below" another layer, area, or plate, intervening layers, areas, or plates may be absent therebetween.

Throughout the specification, when an element is referred to as being "connected" to another element, the element may be "directly connected" to the other element, or "electrically connected" to the other element and one or more intervening elements may be disposed therebetween.

It will be understood that, although the terms "first," "second," and "third" may be used herein to describe various elements, these elements should not be limited by these terms.

Figure 1:
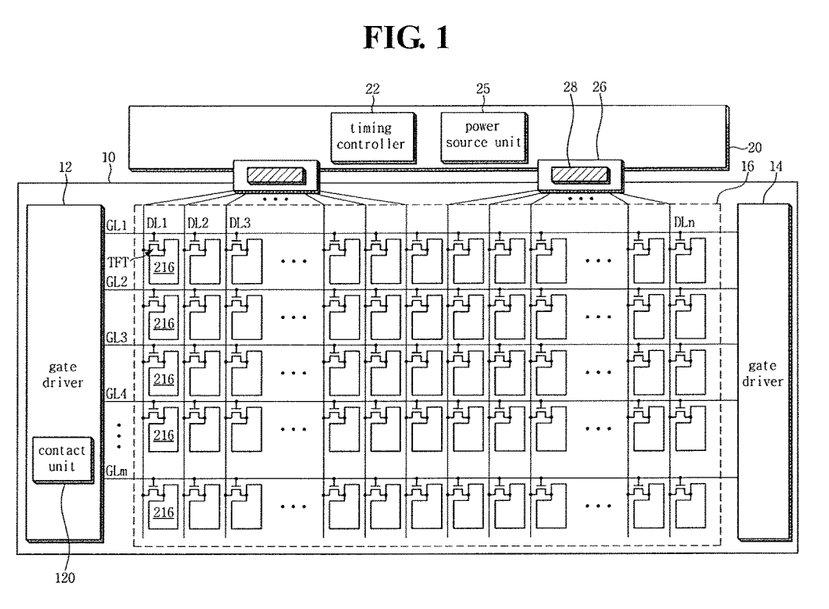
FIG. 1 is a schematic plan view illustrating a liquid crystal display ("LCD") device according to an exemplary embodiment of the present invention.

FIG. 1 is a schematic plan view illustrating a liquid crystal display ("LCD") device according to an exemplary embodiment of the present invention.

Referring to FIG. 1, an LCD device may include a liquid crystal panel 10 on which a display area 16 and gate drivers 12 and 14 for driving a gate line GL of the display area 16 are disposed, a circuit film 26 on which a data integrated circuit ("IC") 28 for driving a data line DL of the display area 16 is disposed. The circuit film 26 may be connected to a printed circuit board ("PCB") 20 and the liquid crystal panel 10. A timing controller 22 may be disposed on the PCB 20. A power source unit 25 may be disposed on the PCB 20. A contact unit 120 may be disposed on the gate driver 12. The liquid crystal panel 10 is illustrated as including only a thin film transistor substrate, absent a color filter substrate. However, exemplary embodiments of the present invention are not limited thereto.

Gate lines GL1 to GLm and data lines DL1 to DLn may be disposed on the display area 16 of the liquid crystal panel 10. The gate lines GL1 to GLm and data lines DL1 to DLn may intersect one another.

A thin film transistor TFT and a pixel 216 may be disposed in a pixel area defined by the intersecting gate lines GL and data lines DL.

The thin film transistor TFT may supply, to the pixel 216, a data signal from at least one of the data lines DL 1 to DLn in response to a scan signal from at least one of the gate lines GL1 to GLm. The pixel 216 may form an electric field, along with a common electrode 131 (see, e.g., FIG. 2) of a color filter substrate, based on the supplied data signal, and thus liquid crystals for each sub-pixel may be controlled and an image may be displayed.

The gate drivers 12 and 14 may be respectively disposed on opposite outer portions of the display area 16. The opposite outer portions may be non-display areas in an outer portion of the liquid crystal panel 10. The gate drivers 12 and 14 may sequentially drive the gate lines GL1 to GLm. For example, the gate drivers 12 and 14 may drive the gate lines GL1 to GLm at both sides of the gate lines GL1 to GLm, or may separately drive the gate lines GL1 to GLm by dividing into odd-numbered gate lines GL1, GL3, . . . , and even-numbered gate lines GL2, GL4, . . . , respectively and driving only a particular set of the divided gate lines.

Each of the gate drivers 12 and 14 may include a plurality of shift registers for individually driving the gate lines GL1 to GLm. Each of the shift registers may include a plurality of thin film transistors TFT. The gate drivers 12 and 14, along with the thin film transistors TFT, a plurality of signal lines and electrodes of the display area 16, may be disposed on the thin film transistor substrate.

Each of the plurality of data ICs 28 may separately drive the data lines DL1 to DLn of the display area 16. Each of the plurality of data ICs 28 may be disposed on the circuit film 26. The circuit film 26 may be connected to the liquid crystal panel 10 and the PCB 20 through an anisotropic conductive film ("ACF"). The circuit film 26 on which the data IC 28 is disposed may be a tape carrier package ("TCP") or a chip on film ("COF"). According to an exemplary embodiment of the present invention, the data ICs 28 may be disposed directly on the thin film transistor substrate of the liquid crystal panel 10 in a chip on glass ("COG") manner, without using the circuit film 26. The data ICs 28 may convert digital data from the timing controller 22 into analog data using a gamma voltage from a gamma voltage unit, and may supply the analog data to data lines DL1 to DLn corresponding to each horizontal period for driving the gate line GL of the display area 16.

The timing controller 22 disposed on the PCB 20 may control the data ICs 28 and the gate drivers 12 and 14. A video data signal and a plurality of data control signals from the timing controller 22 may be supplied to each of the data ICs 28 via the PCB 20 and the circuit film 26. A plurality of gate control signals may be supplied to the gate drivers 12 and 14 via the PCB 20, the circuit film 26, and the thin film transistor substrate of the liquid crystal panel 10. The power source unit 25 may generate and may supply a plurality of driving voltages to the data ICs 28, the gate drivers 12 and 14, and the liquid crystal panel 10.

Figure 2:
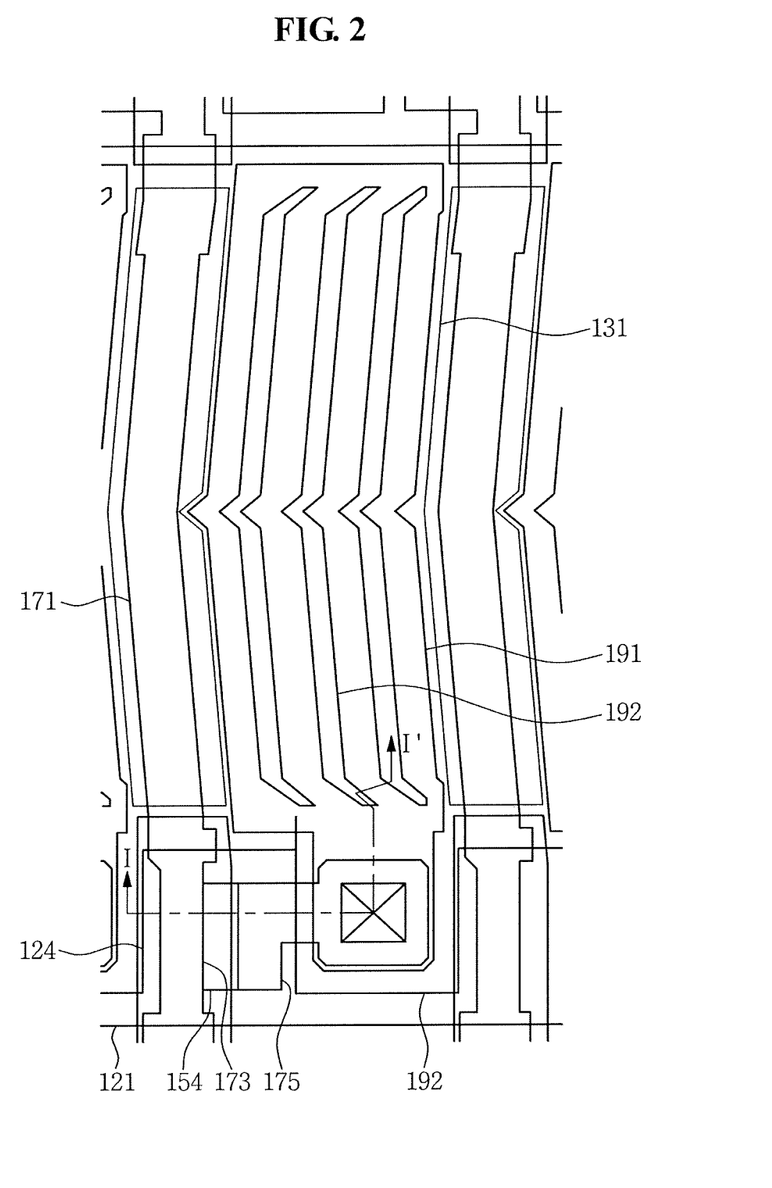
FIG. 2 is a layout view illustrating a pixel of a display device according to an exemplary embodiment of the present invention.
Figure 3:
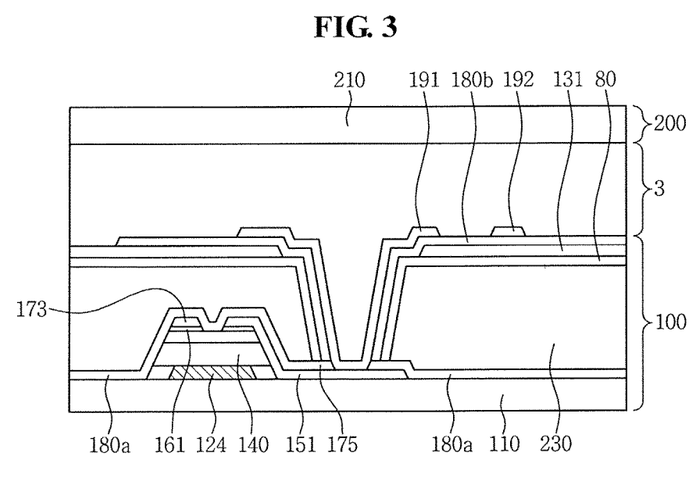
FIG. 3 is a cross-sectional view of the display device taken along section line I-I' of FIG. 2.

FIG. 2 is a layout view illustrating a pixel of a display device according to an exemplary embodiment of the present invention. FIG. 3 is a cross-sectional view of the display device taken along section line I-I' of FIG. 2.

Referring to FIGS. 2 and 3, a plurality of gate lines 121 may be disposed on a display area of a first substrate 110.

Each of the plurality of gate lines 121 may include a gate pad portion having a relatively wide planar area. A gate driving circuit generating a gate signal may be disposed on a flexible printed circuit film that is attached to the first substrate 110, or may be disposed directly on the first substrate 110.

The gate line 121 may include or be disposed of one of the followings: an aluminum (Al) based metal such as Al or an Al alloy, a silver (Ag) based metal such as Ag or an Ag alloy, a copper (Cu) based metal such as Cu or a Cu alloy, and a molybdenum (Mo) based metal such as Mo or a Mo alloy, chromium (Cr), tantalum (Ta), and titanium (Ti). The gate line 121 may have a monolayer structure or a multilayer structure including two or more conductive layers.

A gate electrode 124 may be disposed on the first substrate 110. The gate electrode 124 may protrude from the gate line 121. The gate electrode 124 and the gate line 121 may include a same material.

A gate insulating layer 140 may be disposed on the gate line 121. The gate insulating layer 140 may include an inorganic insulating material such as silicon nitride ($SiN_x$) or silicon oxide ($SiO_x$).

Referring to FIG. 3, the gate insulating layer 140 may have a shape similar to a shape of the gate electrode 124, and may have a width wider than a width of the gate electrode 124.

According to an exemplary embodiment of the present invention, the width of the gate insulating layer 140 may be in a range of from about 0.2 µm (micrometers) to about 4 µm wider than the width of the gate electrode 124. However, exemplary embodiments of the present invention are not limited thereto and the width of the gate insulating layer 140 may be any desired width.

A semiconductor layer may be disposed on the gate insulating layer 140. The semiconductor layer may include a semiconductor layer 151, a protruding portion 154, and an ohmic contact member 161. The semiconductor layer 151 may include amorphous silicon, polysilicon, and an oxide semiconductor.

The semiconductor layer 151 may include an end portion below a data pad portion. The data pad portion will be described in more detail below.

A plurality of ohmic contact members 161 may be disposed on the semiconductor layer 151. The plurality of ohmic contact members 161 may be a pair of ohmic contact members that face one another with respect to the gate electrode 124. The ohmic contact member 161 may be disposed below the data pad portion which will be described in more detail below.

The ohmic contact member 161 may include silicide or n+ hydrogenated amorphous silicon doped with n-type impurities such as phosphorus at a relatively high concentration. However, the ohmic contact member 161 may be omitted. For example, in a case in which the semiconductor layer 151 is an oxide semiconductor, the ohmic contact member 161 may be omitted.

Data conductors may be disposed on the ohmic contact member 161, and may include a plurality of data lines 171 and a plurality of drain electrodes 175.

The data lines 171 may transmit a data signal and may extend in a longitudinal direction which may intersect the gate line 121. Each of the data lines 171 may include a plurality of source electrodes 173 extending toward the gate electrode 124, and the data pad portion which may connect with another layer or an external driving circuit. A data driving circuit generating a data signal may be disposed on the flexible printed circuit film that may be attached to the first substrate 110, or may be disposed directly on the first substrate 110.

The data line 171 may be bent at one or more points, and may form an oblique angle with respect to an extending direction of the gate line 121. The oblique angle formed between the data line 171 and the extending direction of the gate line 121 may be about 45 degrees or more. However, the data line 171 may extend in a straight line.

The data conductors including the data line 171 and the drain electrode 175 may have a monolayer structure, or a multilayer structure including two or more conductive layers.

The drain electrode 175 may include a rod-shaped end portion that faces the source electrode 173 with respect to the gate electrode 124, and may include a second relatively wide end portion.

The gate electrode 124, the source electrode 173, and the drain electrode 175, along with the protruding portion 154 of the semiconductor layer 151, may form a thin film transistor which may be configured to operate as a switching element. The semiconductor layer 151 may have a planar shape substantially the same as that of the data line 171 and substantially the same as that of the drain electrode 175, except for the protruding portion 154 of the semiconductor layer 151 on which the thin film transistor may be disposed.

The source electrode 173 or the drain electrode 175 may contact an end portion of the gate insulating layer 140. The source electrode 173 or the drain electrode 175 may be spaced apart from an end portion of the gate electrode 124.

The data line 171 and the drain electrode 175 may include a refractory metal, such as Mo, Cr, Ta, and Ti, or an alloy thereof, and may have a multilayer structure including a refractory metal layer and a low-resistance conductive layer. Examples of the multilayer structure may include: a double-layer structure including a Cr or Mo (alloy) lower layer and an Al (alloy) upper layer; and a triple-layer structure including a Mo (alloy) lower layer, an Al (alloy) intermediate layer, and a Mo (alloy) upper layer. According to exemplary embodiments of the present invention, the data line 171 and the drain electrode 175 may include various metals or conductive materials, instead of, or in addition to the materials described above.

A first passivation layer 180a may be disposed on the data conductors, for example, the data line 171 and the drain electrode 175, the gate insulating layer 140, and the protruding portion 154 of the semiconductor layer 151 which may be exposed. The first passivation layer 180a may include an inorganic insulating material, such as silicon nitride ($SiN_x$) or silicon oxide ($SiO_x$).

A color filter 230 may be disposed on the first passivation layer 180a. The color filter 230 may display one of primary colors. Examples of the primary colors may include yellow, cyan, and magenta, or the three primary colors of red, green, and blue. The color filter 230 may display a mixed color of the primary colors or may display a white color, other than the primary colors.

An overcoat layer 80 may be disposed on the color filter 230. The overcoat layer 80 may be omitted.

The overcoat layer 80 may reduce or prevent the infiltration of a pigment of the color filter 230 into a liquid crystal layer 3. The overcoat layer 80 may include an inorganic insulating layer or an organic insulating layer.

The common electrode 131 may be disposed on the overcoat layer 80. The common electrode 131 may include a transparent conductive material. The common electrode 131 may have a planar shape and may be disposed over substantially an entire surface of the first substrate 110. The common electrode 131 may be connected to a common voltage line in a peripheral area of the display area and may receive a common voltage.

A pixel electrode 191 may be disposed on a second passivation layer 180b. The pixel electrode 191 may include a bent edge that is substantially parallel to a first bent portion and a second bent portion of the data line 171. The pixel electrode 191 may include a plurality of cut-out portions, and may include a plurality of first branch electrodes 192 defined by the plurality of cut-out portions.

In an exemplary embodiment of the present invention, respective portions of the first passivation layer 180a, the color filter 230, the overcoat layer 80, the second passivation layer 180b on the drain electrode 175 may be removed to expose a portion of the drain electrode 175, and the exposed portion of the drain electrode 175 and the pixel electrode 191 may be connected to one another.

An alignment layer may be dispose on the pixel electrode 191 and the second passivation layer 180b. The alignment layer may be a homogeneous alignment layer and may be rubbed in a predetermined direction. The alignment layer may include a photo-reactive material, and may be photo-aligned.

The liquid crystal layer 3 may be disposed between the first substrate 110 and a second substrate 210.

The liquid crystal layer 3 may include a nematic liquid crystal material having a positive dielectric anisotropy. The nematic liquid crystal molecules of the liquid crystal layer 3 may have a major axis that is substantially parallel to the first substrate 110 and the second substrate 210.

The pixel electrode 191 and the common electrode 131, which may be electric field generating electrodes, may generate an electric field, and thus liquid crystal molecules of the liquid crystal layer 3 on the pixel electrode 191 and on the common electrode 131 may rotate in a direction parallel to the direction of the electric field. The polarization of light transmitted through the liquid crystal layer 3 may vary based on the rotational direction of the liquid crystal molecules.

The second substrate 210 may include a transparent material such as glass or plastic.

A plurality of color filters 230 may be disposed on the second substrate 210. Each of the color filters 230 may display one of red, green, and blue colors, or may display another color.

Figure 4:
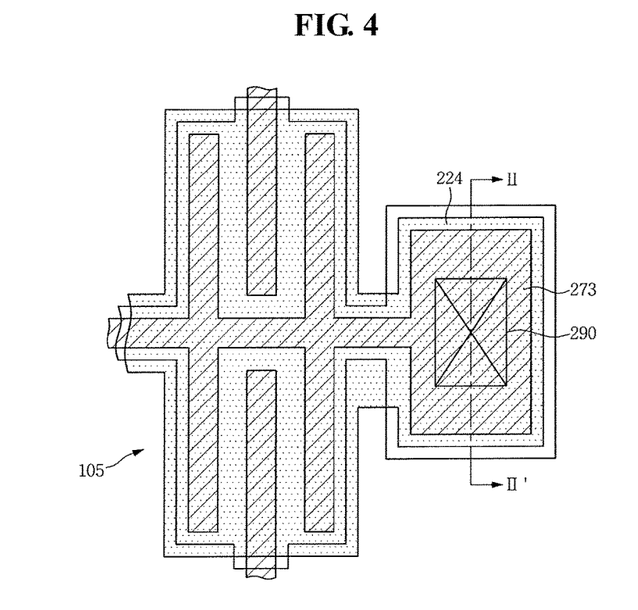
FIG. 4 is a partial enlarged view of a contact unit included in the gate driver of FIG. 1.

FIG. 4 is a partial enlarged view of a contact unit included in the gate driver of FIG. 1.

The gate driver 12 may include a pair of thin film transistors 105 connected in parallel and the contact unit 120 connected to the pair of thin film transistors 105. In the contact unit 120, a first pad electrode 224 and a second pad electrode 273 that may protrude from the pair of thin film transistors 105 may be connected to one another.

The contact unit 120 is not limited to being connected to the pair of thin film transistors 105, and may have any structure in which a gate metal layer and a source and/or drain metal layer are connected on the thin film transistor substrate.

The pair of thin film transistors 105 may include the gate electrode 124, the semiconductor layer 151 overlapping the gate electrode 124. The gate insulating layer 140 may be disposed between the semiconductor layer 151 and the gate electrode 124. The source and the drain electrodes 173 and 175 may overlap the semiconductor layer 151 and may be spaced apart from one another at a predetermined interval. The source electrode 173 may protrude from the semiconductor layer 151 and may have separate upper and lower portions above and below the semiconductor layer 151, respectively. The source electrode 173 may surround three sides of the drain electrode 175 having separate upper and lower portions, and two channels of the semiconductor layer 151 may be disposed between the source electrode 173 and the drain electrode 175.

Figure 5:
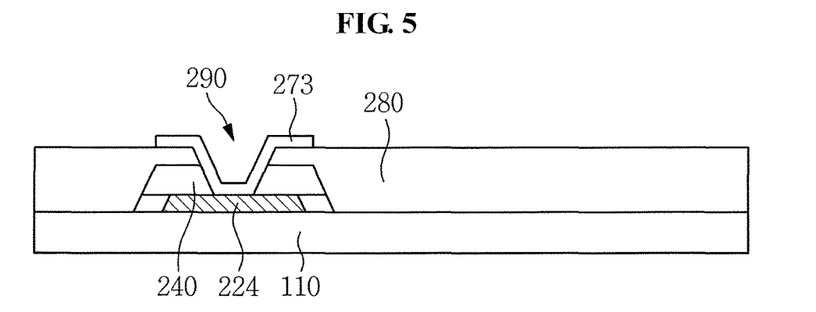
FIG. 5 is a cross-sectional view of the contact unit taken along section line II-II' of FIG. 4.

FIG. 5 is a cross-sectional view of the contact unit taken along section line II-II' of FIG. 4.

The contact unit 120 may include the first pad electrode 224, the second pad electrode 273, a third passivation layer 280, and a contact hole 290.

Referring to FIGS. 2 and 5, the first pad electrode 224 may be disposed on the non-display area, and may be connected to the gate line 121 and the gate electrode 124.

A pad electrode insulating layer 240 may be disposed on the first pad electrode 224.

The pad electrode insulating layer 240 may have a shape similar to a shape of the first pad electrode 224, and may have a width wider than a width of the first pad electrode 224.

According to an exemplary embodiment of the present invention, the width of the pad electrode insulating layer 240 may be in a range of from about 0.2 µm to about 4 µm wider than the width of the first pad electrode 224. However, exemplary embodiments of the present invention are not limited thereto and the width of the pad electrode insulating layer 240 may be any desired width.

The second pad electrode 273 may be spaced apart from an end portion of the first pad electrode 224.

The third passivation layer 280 may be disposed on the pad electrode insulating layer 240. The third passivation layer 280 may include an organic insulating layer or an inorganic insulating layer.

The pad electrode insulating layer 240 and the third passivation layer 280 may include the contact hole 290 through which a portion of the first pad electrode 224 may be exposed.

The second pad electrode 273 may be disposed on the pad electrode insulating layer 240. The pad electrode insulating layer 240 may be a metal layer. The pad electrode insulating layer 240 may overlap a portion of the first pad electrode 224 that is exposed through the contact hole 290, and may be connected to the first pad electrode 224.

A gate pad and a data pad may contact the driving circuit, and a pad for an electric contact with the PCB may contact the PCB.

A method of manufacturing the display area of the display device according to an exemplary embodiment of the present invention will be described in more detail below with reference to FIGS. 6A, 6B, 6C, 6D, and 6E.

FIGS. 6A, 6B, 6C, 6D, and 6E are cross-sectional views illustrating processes of the method of manufacturing the display area of a display device according to an exemplary embodiment of the present invention.

Figure 6A:
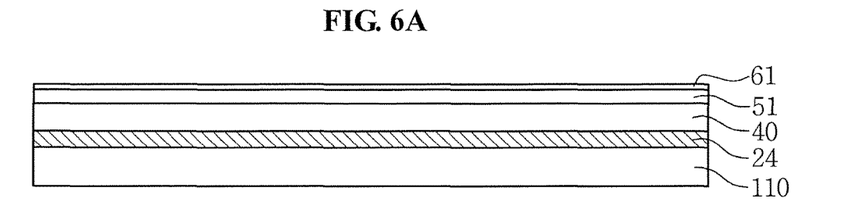
FIGS. 6A, 6B, 6C, 6D, and 6E are cross-sectional views illustrating processes of a method of manufacturing a display area of a display device according to an exemplary embodiment of the present invention.

Referring to FIG. 6A, a metal layer 24, an inorganic insulating material 40, a semiconductor material 51, and an ohmic contact member layer 61 may be sequentially formed on the first substrate 110. The first substrate 110 may include a transparent material such as glass or plastic.

Figure 6B:
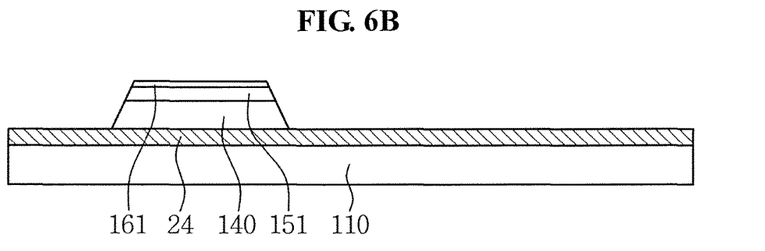

Referring to FIG. 6B, an active layer including the gate insulating layer 140, the semiconductor layer 151, and the ohmic contact member layer 61 may be formed on the first substrate 110 through a photolithography process.

Figure 6C:
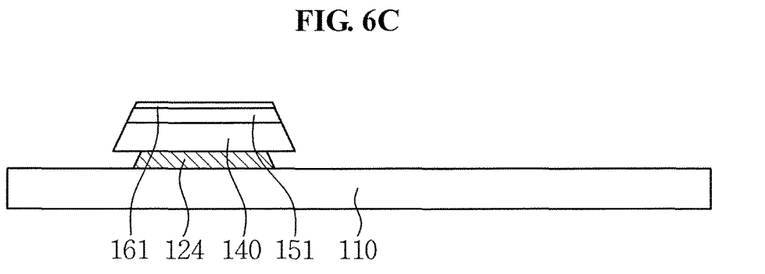

Referring to FIG. 6C, the gate line 121 and the gate electrode 124 may be dry-etched or wet-etched using the gate insulating layer 140 as a mask.

The etching of the metal layer 24 may be performed in a high-density plasma ("HDP") etching apparatus in which inductively coupled plasma ("ICP"), decoupled plasma source ("DPS"), or electron cyclotron resonance ("ECR") is used. At this time, the etching may be performed using an SF-based gas or a $Cl_2$ gas solely or in combination, and the etching may be performed including another gas, such as a main gas. The SF-based gas may flow at a flow rate in a range of from about 10 standard cubic centimeters/minute (sccm) to about 50 sccm, and the $Cl_2$ gas may flow at a flow rate in a range of about 50 sccm to about 200 sccm.

However, the etching technique according to exemplary embodiments of the present invention is not limited thereto.

According to an exemplary embodiment of the present invention, the etching of the gate line 121 and the gate electrode 124 may be performed by an over-etching technique. Thus, the gate insulating layer 140 may have a width in a range of from about 0.2 µm to about 4 µm wider than the width of the gate electrode 124, and may have a shape similar to the shape of the gate electrode 124.

Figure 6D:
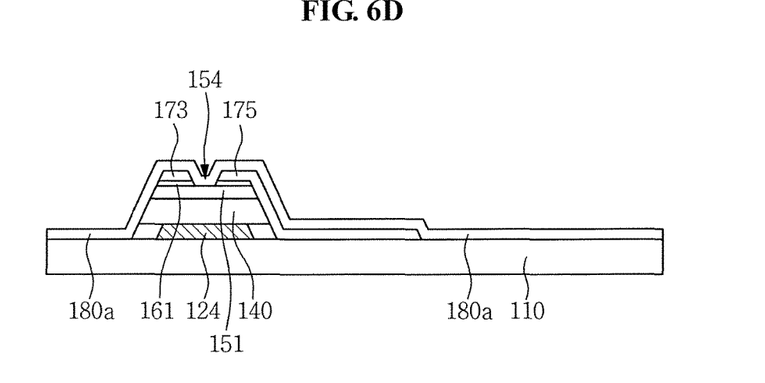

Referring to FIG. 6D, a portion of the ohmic contact member 161 may be etched to have the protruding portion 154 through which the semiconductor layer 151 may be exposed. Conductors may be disposed on the ohmic contact member 161 to form the source electrode 173 and the drain electrode 175.

The conductor may include a relatively low-resistance opaque conductive material such as, for example, aluminum (Al), an Al alloy, tungsten (W), copper (Cu), nickel (Ni), chromium (Cr), molybdenum (Mo), titanium (Ti), platinum (Pt), or tantalum (Ta). The conductor may include a transparent conductive material such as, for example, indium-tin oxide ("ITO") or indium-zinc oxide ("IZO"), or may have a multilayer structure in which two or more of the conductive materials are stacked.

Figure 6E:
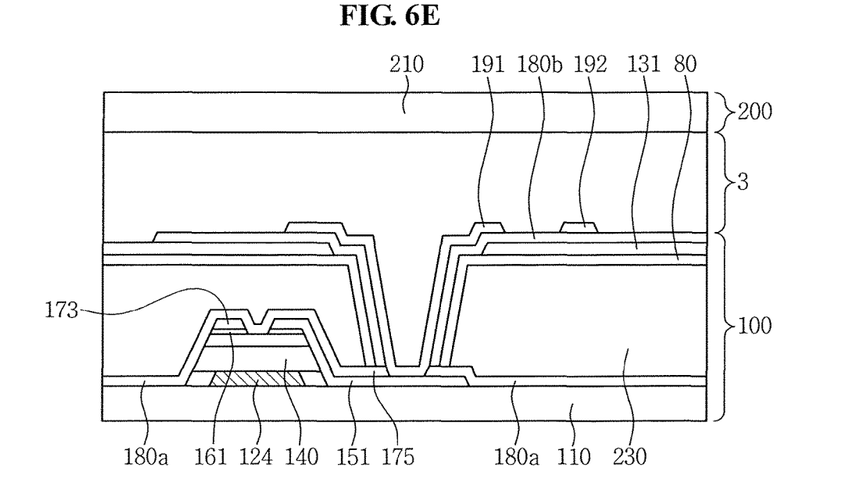

Referring to FIG. 6E, the first passivation layer 180a may be formed on the data conductors, for example, the data line 171 (see, e.g., FIG. 2) and the drain electrode 175. The first passivation layer 180a may include an inorganic insulating material such as silicon nitride ($SiN_x$) or silicon oxide ($SiO_x$).

The color filter 230 and the common electrode 131 may be formed on the first passivation layer 180a. According to an exemplary embodiment of the present invention, the common electrode 131 formed on the first substrate 110 may have a planar shape.

The overcoat layer 80 may be disposed between the color filter 230 and the common electrode 131.

The second passivation layer 180b may be formed on the common electrode 131, and respective portions of the first passivation layer 180a, the color filter 230, the overcoat layer 80, and the second passivation layer 180b may be removed to expose a portion of the drain electrode 175.

The pixel electrode 191 may be formed on the second passivation layer 180b. To form the pixel electrode 191 that includes a plurality of branch electrodes, for example, the first branch electrodes 192, a material for forming the pixel electrode 191 may be disposed on substantially an entire surface of the second passivation layer 180b, and the material for forming the pixel electrode 191 may be selectively removed to form a plurality of cut-out portions.

The pixel electrode 191 may include a transparent conductive material such as, for example, indium-tin oxide ("ITO") or indium-zinc oxide ("IZO").

The pixel electrode 191 may cover the portion of the drain electrode 175 that is exposed. The pixel electrode 191 may be electrically connected to the drain electrode 175.

The liquid crystal layer 3 may be disposed between the first substrate 110 and the second substrate 210, and the first substrate 110 and the second substrate 210 may be attached to one another to form an LCD device according to exemplary embodiments of the present invention.

The second substrate 210 may include a transparent material such as glass or plastic.

The plurality of color filters 230 may be disposed on the second substrate 210. Each of the color filters may display one of red, green, and blue colors, or may display another color.

A method of manufacturing the non-display area of the display device according to an exemplary embodiment of the present invention will be described in more detail below with reference to FIGS. 7A, 7B, 7C, 7D, and 7E.

FIGS. 7A, 7B, 7C, 7D, and 7E are cross-sectional views illustrating processes of the method of manufacturing a non-display area of a display device according to an exemplary embodiment of the present invention.

Figure 7A:
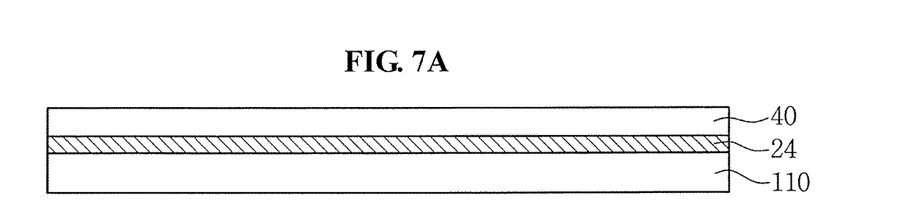
FIGS. 7A, 7B, 7C, 7D, and 7E are cross-sectional views illustrating processes of a method of manufacturing a non-display area of a display device according to an exemplary embodiment of the present invention.

Referring to FIG. 7A, the metal layer 24 and the inorganic insulating material 40 may be sequentially formed on the first substrate 110, which may include a transparent material such as glass or plastic.

Figure 7B:
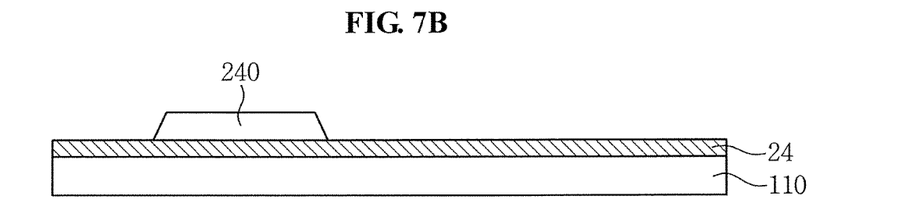

Referring to FIG. 7B, the pad electrode insulating layer 240 may be patterned on the first substrate 110 through a photolithography process.

Figure 7C:
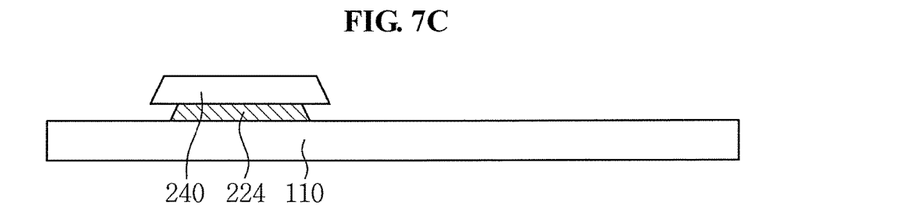

Referring to FIG. 7C, the first pad electrode 224 may be dry-etched or wet-etched using the pad electrode insulating layer 240 as a mask.

Figure 7D:
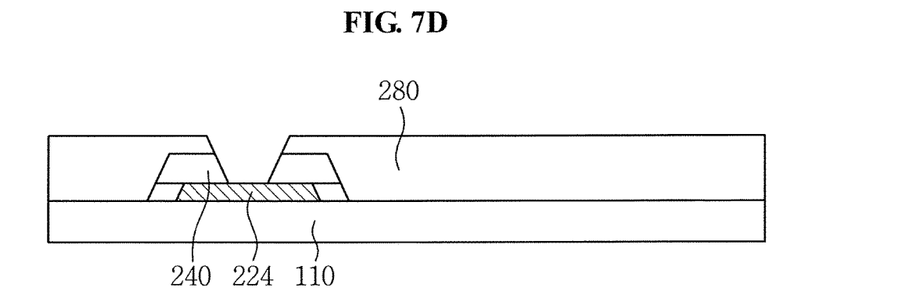

Referring to FIG. 7D, the third passivation layer 280 may be formed on the pad electrode insulating layer 240. The third passivation layer 280 may include an organic insulating layer or an inorganic insulating layer. Respective portions of the pad electrode insulating layer 240 and the third passivation layer 280 may be etched to form the contact hole 290 through which a portion of the first pad electrode 224 may be exposed.

Figure 7E:
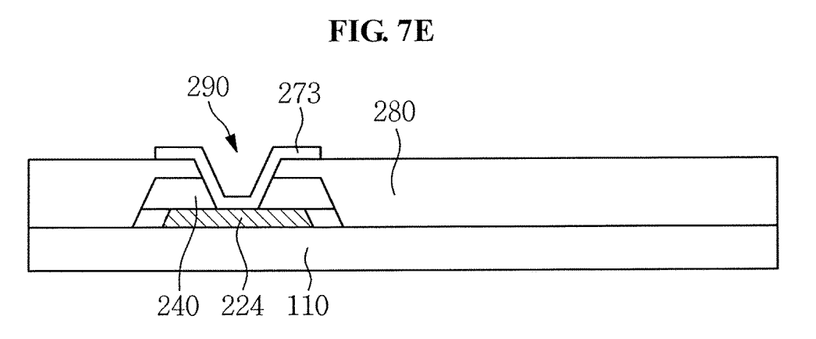

Referring to FIG. 7E, the second pad electrode 273 may be disposed on the first pad electrode 224 and may overlap the portion of the first pad electrode 224 that is exposed through the contact hole 290. The second pad electrode 273 may be connected to the first pad electrode 224.

According to at least one exemplary embodiment of the present invention, manufacturing costs of the display device may be reduced and the number of processes for forming the display device may be reduced.

The size of the contact hole according to exemplary embodiments of the present invention may be reduced, and thus a relatively narrow bezel may be formed.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
    a first substrate including a display area and a non-display area;
    a gate line and a gate electrode in the display area;
    a data line connected to the gate line;
    a gate insulating layer on the gate line and the gate electrode;
    a semiconductor layer on the gate insulating layer;
    a drain electrode and a source electrode on the semiconductor layer;
    a first passivation layer on the drain electrode and the source electrode;
    a color filter on the first passivation layer;
    a common electrode on the first passivation layer;
    a second passivation layer on the common electrode; and
    a pixel electrode on the second passivation layer,
    wherein the gate insulating layer has substantially a same shape as a shape of the gate electrode,
    wherein the gate insulating layer has a width wider than a width of the gate electrode,
    wherein the gate insulating layer is spaced apart from the first substrate, and
    wherein a side surface of the gate electrode is exposed below a bottom surface of the gate insulating layer.

2. The display device of claim 1, wherein one of the drain electrode and the source electrode contacts an end portion of the gate insulating layer.

3. The display device of claim 2, wherein one of the drain electrode and the source electrode is spaced apart from an end portion of the gate electrode.

4. The display device of claim 3, wherein the width of the gate insulating layer is in a range of about 0.2 µm to about 4 µm wider than the width of the gate electrode.

5. The display device of claim 4, wherein the pixel electrode is connected to the semiconductor layer.

6. The display device of claim 5, wherein the pixel electrode comprises a plurality of cut-out portions, and wherein the common electrode has a planar shape.

7. The display device of claim 6, further comprising an overcoat layer between the color filter and the common electrode.

8. The display device of claim 7, further comprising:
    a second substrate disposed opposite the first substrate; and
    a liquid crystal layer between the first substrate and the second substrate.

9. The display device of claim 8, wherein the semiconductor layer comprises at least one selected from amorphous silicon, polysilicon, and an oxide semiconductor.

10. The display device of claim 1, further comprising:
    a first pad electrode on the non-display area;
    a pad electrode insulating layer on the first pad electrode, the pad electrode insulating layer having a contact hole through which a portion of the first pad electrode is exposed;
    a third passivation layer on the pad electrode insulating layer; and
    a second pad electrode on the first pad electrode and the third passivation layer,
    wherein the pad electrode insulating layer has substantially a same shape as a shape of the first pad electrode, and wherein the pad electrode insulating layer has a width wider than a width of the first pad electrode.

11. The display device of claim 10, wherein the width of the pad electrode insulating layer is in a range of about 0.2 µm to about 4 µm wider than the width of the first pad electrode.

12. The display device of claim 1, wherein the gate insulating layer is positioned entirely above the gate electrode.

13. A display device comprising:
    a first substrate including a display area and a non-display area;
    a gate line and a gate electrode in the display area;
    a data line connected to the gate line;
    a gate insulating layer on the gate line and the gate electrode;
    a semiconductor layer on the gate insulating layer;
    a drain electrode and a source electrode on the semiconductor layer;
    a first passivation layer on the drain electrode and the source electrode;
    a color filter on the first passivation layer;
    a common electrode on the first passivation layer;
    a second passivation layer on the common electrode; and
    a pixel electrode on the second passivation layer,
    wherein the gate insulating layer has substantially a same shape as a shape of the gate electrode,
    wherein the gate insulating layer has a width wider than a width of the gate electrode,
    wherein the first substrate, the gate electrode, the gate insulating layer and the drain electrode define a space, and
    wherein a side surface of the gate electrode is exposed below a bottom surface of the gate insulating layer.

* * * * *